(12) United States Patent
Mansouri et al.

(10) Patent No.: US 10,451,502 B2
(45) Date of Patent: Oct. 22, 2019

(54) METHOD FOR MONITORING AN ELECTROMECHANICAL ACTUATOR SYSTEM

(71) Applicant: SAFRAN ELECTRONICS & DEFENSE, Boulogne Billancourt (FR)

(72) Inventors: Badr Mansouri, Boulogne Billancourt (FR); Alexandre Guyamier, Boulogne Billancourt (FR); Jerome Piaton, Boulogne Billancourt (FR)

(73) Assignee: SAFRAN ELECTRONICS & DEFENSE, Boulogne Billancourt (FR)

( * ) Notice: Subject to any disclaimer, the term of this patent is extended or adjusted under 35 U.S.C. 154(b) by 0 days.

(21) Appl. No.: 16/062,971

(22) PCT Filed: Dec. 1, 2016

(86) PCT No.: PCT/EP2016/079472
§ 371 (c)(1),
(2) Date: Jun. 15, 2018

(87) PCT Pub. No.: WO2017/102362
PCT Pub. Date: Jun. 22, 2017

(65) Prior Publication Data
US 2019/0107451 A1    Apr. 11, 2019

(30) Foreign Application Priority Data

Dec. 15, 2015 (FR) ..................................... 15 62370

(51) Int. Cl.
*G01L 5/00* (2006.01)
*H02P 21/20* (2016.01)
(Continued)

(52) U.S. Cl.
CPC ............ *G01L 5/0042* (2013.01); *B62D 5/046* (2013.01); *B64C 13/50* (2013.01); *B64F 5/60* (2017.01);
(Continued)

(58) Field of Classification Search
CPC .............................. B62D 5/046; G01L 5/0042
See application file for complete search history.

(56) References Cited

U.S. PATENT DOCUMENTS

| | | | | |
|---|---|---|---|---|
| 4,680,526 A | * | 7/1987 | Okuyama | ................ H02P 21/04 318/802 |
| 2007/0132446 A1 | * | 6/2007 | Kleinau | ................ B60L 15/025 324/160 |

(Continued)

FOREIGN PATENT DOCUMENTS

| | | |
|---|---|---|
| CN | 101964624 B | 8/2012 |
| EP | 2902285 A1 | 8/2015 |

(Continued)

OTHER PUBLICATIONS

Shang Yaoxing, Study on Friction Torque Loading with an Electrohydraulic Load Simulator, Chinese Journal of Aeronautics 22 (2009) 691-699 (Year: 2009).*

*Primary Examiner* — Michael J Dalbo
(74) *Attorney, Agent, or Firm* — Muncy, Geissler, Olds & Lowe, P.C.

(57) ABSTRACT

The invention relates to a method of monitoring an electromechanical actuator system, the method comprising the steps of estimating the voltage drop in the power supply to the motor associated with defects of the inverter by means of a Kalman filter, estimating (300) at least the electromagnetic torque coefficient of the motor by taking account of the estimated voltage drop, and calculating (400) the electro- (Continued)

magnetic torque of the motor from the electromagnetic torque coefficient of the motor.

5 Claims, 3 Drawing Sheets (51) Int. Cl.
  *H02P 21/14*   (2016.01)
  *B62D 5/04*   (2006.01)
  *G05B 23/02*   (2006.01)
  *E05F 15/603*   (2015.01)
  *B64F 5/60*   (2017.01)
  *B64C 13/50*   (2006.01)
  *G01R 31/34*   (2006.01)
  *E05F 15/41*   (2015.01)
  *B64D 45/00*   (2006.01)

(52) U.S. Cl.
  CPC .......... *E05F 15/603* (2015.01); *G01R 31/343* (2013.01); *G05B 23/0254* (2013.01); *H02P 21/14* (2013.01); *H02P 21/20* (2016.02); *B60L 2240/423* (2013.01); *B64D 2045/0085* (2013.01); *E05F 15/41* (2015.01); *E05Y 2400/502* (2013.01); *E05Y 2400/512* (2013.01); *E05Y 2900/148* (2013.01)

(56) References Cited

U.S. PATENT DOCUMENTS

| | | | | |
|---|---|---|---|---|
| 2011/0043144 | A1* | 2/2011 | Ueda | B62D 5/046 318/400.02 |
| 2015/0372623 | A1* | 12/2015 | Pramod | H02P 6/08 318/400.02 |
| 2016/0291586 | A1* | 10/2016 | Bobrinskoy | G05B 9/03 |

FOREIGN PATENT DOCUMENTS

| | | | |
|---|---|---|---|
| FR | 3013465 A1 | 5/2015 | |
| FR | 3016325 A1 | 7/2015 | |
| WO | WO-2015075052 A1 * | 5/2015 | ............... G05B 9/03 |

* cited by examiner

METHOD FOR MONITORING AN ELECTROMECHANICAL ACTUATOR SYSTEM

The invention relates to a method of monitoring an electromechanical actuator system.

TECHNOLOGICAL BACKGROUND OF THE INVENTION

In an aircraft, various movable elements such as ailerons, flight control surfaces, or indeed the cover of a thrust reverser, are associated with actuators in order to be capable of being moved between a neutral position and an active position. For this purpose, each actuator is driven by a motor to move in translation between two abutments. By way of example, for a flap, a first abutment is associated with the neutral position of the movable element, and a second abutment is associated with the active position of the movable element. Under such circumstances, when the motor is powered, it drives the actuator, which in turn moves the associated movable element.

In order to detect any failures or ageing in the drive of the movable element, it is appropriate to monitor the motor and the actuator, with this usually being done by sensors associated with the motor and/or the actuator.

Nevertheless, the sensors usually arranged around the motor and/or the actuator do not always enable all of the desired measurements to be obtained for monitoring various electrical and mechanical parameters of the drive. For example, such sensors do not make it possible to measure the electromagnetic torque of the motor, even though it would be possible to deduce parameters therefrom that are of interest in monitoring the drive.

Proposals have been made to measure the electromagnetic torque when the aircraft is on the ground by using external measuring equipment.

Nevertheless, that requires the aircraft to be available on the ground for a sufficient length of time and regularly so as to enable the measurements to be taken and renewed regularly so as to take account of wear in the motor and the actuator.

Proposals have subsequently been made to integrate an additional sensor for sensing electromagnetic torque in the aircraft.

Nevertheless, that necessarily leads to increases in cost and also in weight and bulk, which are not desirable, in particular in the field of aviation.

OBJECT OF THE INVENTION

An object of the invention is to propose a method of monitoring an electromechanical actuator system that avoids the above-mentioned drawbacks.

BRIEF DESCRIPTION OF THE INVENTION

To this end, the invention provides a method of monitoring an electromechanical actuator system including at least one inverter, a motor powered by the inverter, and an actuator driven by the motor, the method comprising the steps of:

estimating the drop of voltage in the power supply to the motor associated with defects of the inverter by means of a Kalman filter taking account of operational data including at least one electric current delivered by the inverter to the motor, at least one control voltage of the inverter, and at least one speed of rotation of the outlet shaft of the motor;

estimating at least the electromagnetic torque coefficient of the motor by taking account of the estimated voltage drop and the operational data including the current delivered by the inverter to the motor, the control voltage of the inverter together with the derivative of the current delivered by the inverter to the motor, and the speed of rotation of the outlet shaft of the motor; and calculating the electromagnetic torque of the motor from the electromagnetic torque coefficient of the motor and the operational data constituted by the electric current delivered by the inverter to the motor.

The method of the invention makes it possible to estimate the electromagnetic torque directly by calculation, thus making it possible to avoid carrying a heavy and expensive specific sensor together with the electromechanical actuator system in order to measure this magnitude. From this electromagnetic torque, it is thus possible optionally to deduce various additional mechanical parameters, e.g. such as the efficiency of the motor-and-actuator assembly, the viscous friction coefficient, and the dry friction torque, which both represent mechanical friction within the motor-and-actuator assembly. This estimate of the electromagnetic torque advantageously takes account of uncertainties about the disturbances due to defects of the inverter that give rise to voltage drops generated by dead periods and also to switching and conduction losses. The estimate of the electromagnetic torque is thus found to be relatively accurate.

Also, the electromagnetic torque is calculated directly in operation and therefore does not require specific maneuvers, with the device carrying the electromechanical actuator system needing to be taken out of service in order to perform such maneuvers.

In the present application, the term "operational data" is used to designate data acquired while the electromechanical actuator system is in service and is being loaded naturally, as contrasted with data that could be obtained by deliberately taking the electromechanical actuator system out of service for this purpose with the data then being obtained during specific maneuvers of the electromechanical actuator system performed deliberately in order to obtain the data. In the event of the electromechanical actuator system being on-board an aircraft, the method of the invention thus uses as operational data, data that is measured in flight (e.g. during takeoff, landing, turning, where these maneuvers are not performed deliberately in order to load the electromechanical actuator system for the purpose of extracting said data therefrom) and not during a maintenance operation performed while the aircraft is on the ground.

In a particular implementation, the method includes an additional step of estimating at least one mechanical parameter of the electromechanical actuator system from the electromagnetic torque, from operational data including at least the speed of rotation of the outlet shaft of the motor, and from the aerodynamic force to which the actuator is subjected.

In a particular implementation, the mechanical parameter is the viscous friction coefficient and/or the dynamic drive friction torque and/or the efficiency of the assembly comprising the motor and the actuator.

In a particular implementation, the method includes an additional step of forming a database and filling said database with the estimates, at least of the electromagnetic torque of the motor.

In a particular implementation, the database is also filled with electrical and mechanical parameters other than the electromagnetic torque of the motor, including at least a resistance of the motor and/or stator inductances of the motor and/or the viscous coefficient of friction of the motor-and-actuator assembly and/or the dynamic dry friction torque of the motor-and-actuator assembly and/or the direct efficiency of the motor-and-actuator assembly and/or the indirect efficiency of the motor-and-actuator assembly.

Other characteristics and advantages of the invention appear from the following description of a particular implementation of the invention.

BRIEF DESCRIPTION OF THE DRAWINGS

The invention can be better understood in the light of the following description of a particular, nonlimiting implementation of the invention. Reference is made to the accompanying figures, in which.

DETAILED DESCRIPTION OF THE INVENTION

Figure 1:
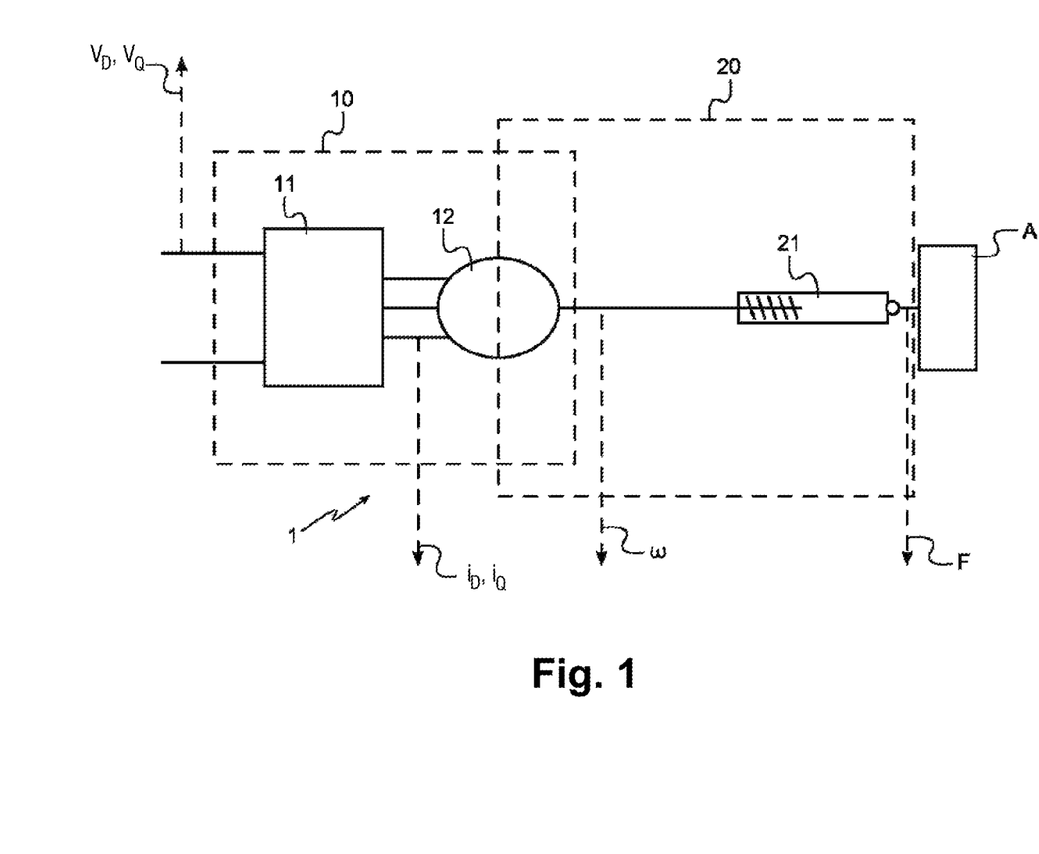
FIG. 1 is a diagrammatic view of an electromechanical actuator system implementing the method in a particular implementation of the invention.
Figure 2:
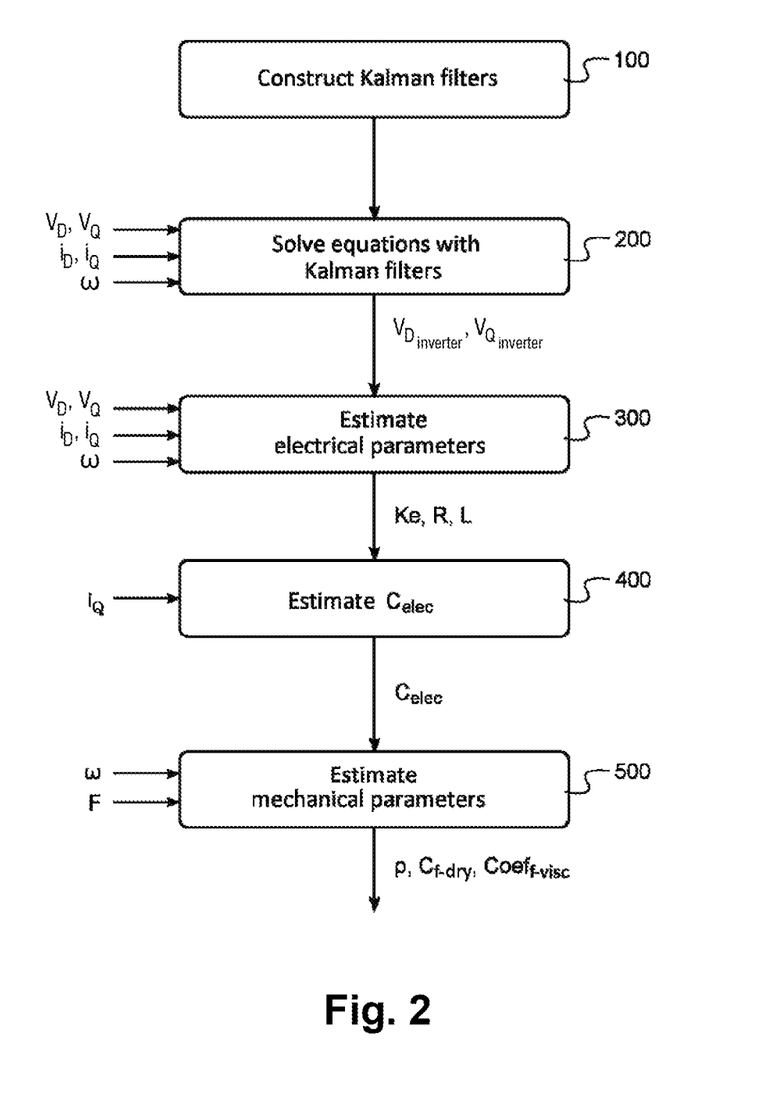
FIG. 2 is a diagram showing the various steps of the method implemented by the system shown diagrammatically in FIG. 1.

With reference to FIGS. 1 and 2, the monitoring method in a particular implementation of the invention is applied in this example to an electromechanical actuator system 1 for actuating an aileron A of an aircraft.

Naturally, this application is not limiting and the method of the invention can be implemented in some other electromechanical actuator system, such as an electromechanical actuator system associated with a cover of a thrust reverser of an aircraft, a flap, or a flight control surface . . . .

In this example, the electromechanical actuator system 1 includes an electrical portion 10 comprising an inverter 11 and a motor 12 powered by the inverter 11. In this example, the motor 12 is a permanent magnet synchronous motor. The electromechanical actuator system also includes a mechanical portion 20 comprising the motor 12 together with an actuator 21 that is connected firstly to the outlet shaft of the motor 12 and secondly to the aileron A, in order to be capable of moving the aileron A. In this example, the actuator 21 is of the linear type, and by way of example it comprises a jack of the ball screw type or of the roller screw type. In a variant, the actuator could be of the rotary type. Under such circumstances, when the motor 12 is powered, it drives the actuator 21, which in turn moves the associated aileron A.

The method of the invention thus serves to monitor the electromechanical actuator system 1 in the manner described below in detail.

Figure 3A:
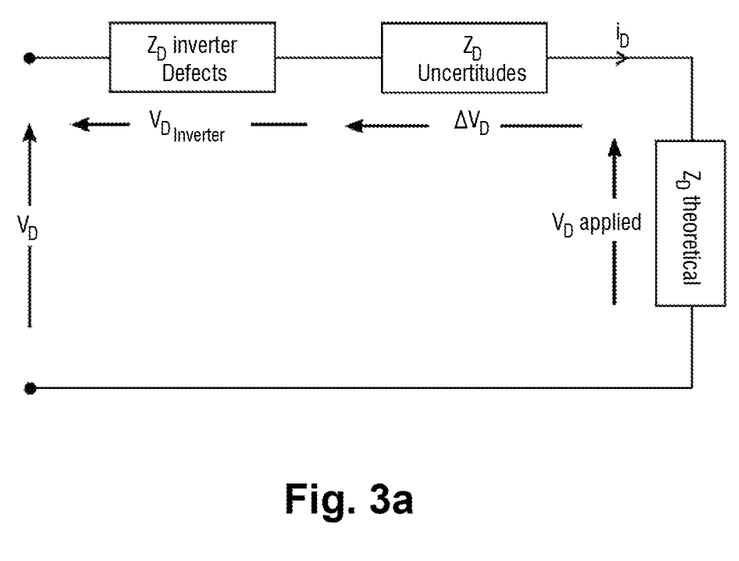
FIGS. 3a and 3b are circuit diagrams modeling an electrical portion of the system shown in FIG. 1 in a frame, respectively relative to the D axis and to the Q axis.
Figure 3B:
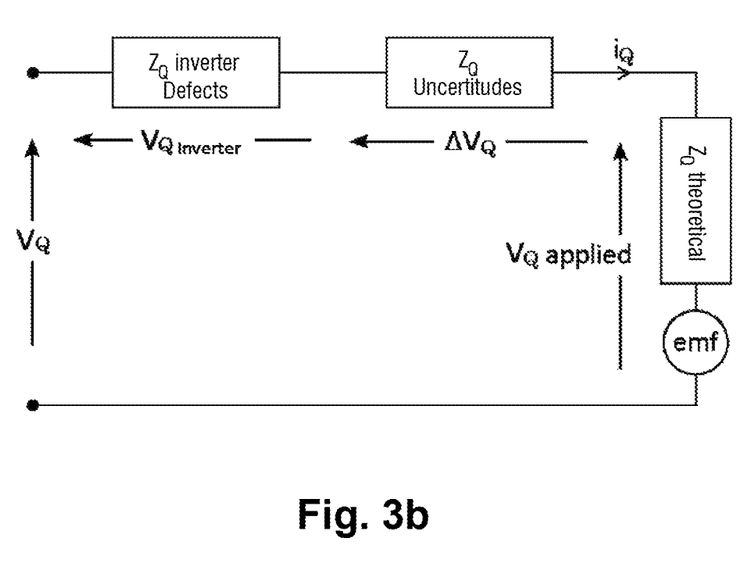

Because the motor 12 is powered by the inverter 11 with three-phase AC, the electrical portion 10 is modeled in a frame (direct axis and quadrature axis), as shown in FIGS. 3a and 3b. The various electrical magnitudes calculated or measured in the present method are thus projected onto the two primary axes of the two-phase model, namely the D (direct) axis and the Q (quadrature) axis. In the description below, the index I refers to the projection of a magnitude onto the U axis, and the index Q refers to the projection of a magnitude onto the q axis.

In order to estimate the voltage drops in the power supply of the motor 12 that are associated with faults of the inverter 11, the first step 100 of the method consists in constructing linear, stationary, and stochastic Kalman filters of the type:

$$\dot{x}(t) = Ax(t) + Bu(t) + Mw(t) \quad (1)$$

$$y(t) = Cx(t) + Du(t) + v(t) \quad (2)$$

continuous; or $$\dot{x}(k+1) = A_{dis}x(k) + B_{dis}u(k) + M_{dis}w(k)$$

$$y(k) = C_{dis}x(k) + D_{dis}u(k) + v(k)$$

discrete.

Such a Kalman model is well known to the person skilled in the art and is therefore not described in detail herein. For more information, reference may be made by way of example to the book "Stochastic Models, Estimation and Control", Volume 141-1, Mathematics in Science and Engineering, by P. S. Maybeck.

In order to apply the Kalman estimator, the following equations are written for the synchronous motor 12 in the frame:

$$\sqrt{\frac{2}{3}}(V_D + V_{D_{Inverter}}) = Ri_D + L_D \frac{d}{dt}i_D - L_Q p \cdot \omega \cdot i_Q - \sqrt{\frac{2}{3}} \Delta V_D \quad (3)$$

$$\sqrt{\frac{2}{3}}(V_Q + V_{Q_{Inverter}}) = Ri_Q + L_Q \frac{d}{dt}i_Q - L_D p \cdot \omega \cdot i_D - \sqrt{\frac{2}{3}} \Delta V_Q$$

where; $V_D$ and $V_Q$ are the power supply voltages that the inverter 11 is controlled to deliver, referred to as the control voltages (which are measured in this example in the current regulator loop of the inverter 11); $V_{D_{Inverter}}$ and $V_{Q_{Inverter}}$ are the inverter voltage drops due to defects of the inverter; $\Delta V_D$ and $\Delta V_Q$ are the uncertainties about the inverter voltage drops due to the uncertainties concerning various electrical parameters of the electrical portion 10; $i_D$ and $i_Q$ are the currents transmitted by the inverter 11 to the motor 12 (which in this example are measured in the motor 12); R is the resistance of the motor 12; $L_D$ and $L_Q$ are the inductances of the stator phases of the motor 12; p is the number of pairs of poles of the motor 12; $\omega$ is the speed of rotation of the outlet shaft of the motor 12; and Ke is the electromagnetic torque coefficient of the motor 12.

The data $i_D$, $i_Q$, $V_D$ and $V_Q$, and $\omega$ comprises operational data as measured by the sensors or as recovered from the commands transmitted by the computer to the inverter 11 while the aircraft is in flight, either in real time, or else by being measured/recovered and then stored in a memory (e.g. of the computer) for subsequent use by the method of the invention.

Before establishing the Kalman model for estimating the voltage drops $V_{D_{Inverter}}$ and $V_{Q_{Inverter}}$ due to inverter defects consideration is given to the following three assumptions.

In a first assumption, the voltage drops $V_{D_{Inverter}}$ and $V_{Q_{Inverter}}$ due to inverter defects are integral type variables associated with random variables $w_D(t)$ and $w_Q(t)$ white noise type without bias and with known spectral power density, i.e.:

$$\frac{dV_{D_{Inverter}}}{dt} = w_D(t)$$

$$\frac{dV_{Q_{Inverter}}}{dt} = w_Q(t)$$

In a second assumption, it is considered that the following changes of variable make decoupling possible:

$$U_D = \sqrt{\frac{2}{3}}\, V_D + L_Q p \cdot \omega \cdot i_Q$$

$$U_Q = \sqrt{\frac{2}{3}}\, V_Q - L_D p \cdot \omega \cdot i_D - \omega \cdot Ke$$

In a first assumption, all of the Kalman convergence conditions are satisfied. For more information, reference may be made by way of example to the book "Stochastic Models, Estimation and Control", Volume 141-1, Mathematics in Science and Engineering, by P. S. Maybeck.

Thus, the final model for estimating the voltage drops $V_{D_{Inverter}}$ and $V_{Q_{Inverter}}$ due to defects of the inverter 11 is given by the following state representations:

$$\begin{bmatrix} \frac{d}{dt} i_D \\ \frac{dV_{D_{Inverter}}}{dt} \end{bmatrix} = \begin{bmatrix} -\frac{R}{L_D} & \frac{1}{L_D}\sqrt{\frac{2}{3}} \\ 0 & 0 \end{bmatrix} \begin{bmatrix} i_D \\ V_{D_{Inverter}} \end{bmatrix} +$$

$$\begin{bmatrix} \frac{1}{L_D} \\ 0 \end{bmatrix} U_D + \begin{bmatrix} \frac{1}{L_D}\sqrt{\frac{2}{3}} & 0 \\ 0 & 1 \end{bmatrix} \begin{bmatrix} \Delta V_D \\ w_D(t) \end{bmatrix}$$

$$\begin{bmatrix} \frac{d}{dt} i_Q \\ \frac{dV_{Q_{Inverter}}}{dt} \end{bmatrix} = \begin{bmatrix} -\frac{R}{L_Q} & \frac{1}{L_Q}\sqrt{\frac{2}{3}} \\ 0 & 0 \end{bmatrix} \begin{bmatrix} i_Q \\ V_{Q_{Inverter}} \end{bmatrix} +$$

$$\begin{bmatrix} \frac{1}{L_Q} \\ 0 \end{bmatrix} U_Q + \begin{bmatrix} \frac{1}{L_Q}\sqrt{\frac{2}{3}} & 0 \\ 0 & 1 \end{bmatrix} \begin{bmatrix} \Delta V_Q \\ w_Q(t) \end{bmatrix}$$

There can thus be found the state representations in the general form (1) and (2) for the two axes d and with:

$$x(t) = \begin{bmatrix} i_I \\ V_{D_{Inverter}} \end{bmatrix}, A = \begin{bmatrix} -\frac{R}{L_D} & \frac{1}{L_D}\sqrt{\frac{2}{3}} \\ 0 & 0 \end{bmatrix},$$

$$B = \begin{bmatrix} \frac{1}{L_D} \\ 0 \end{bmatrix}, M = \begin{bmatrix} \frac{1}{L_D}\sqrt{\frac{2}{3}} & 0 \\ 0 & 1 \end{bmatrix}, w(t) = \begin{bmatrix} \Delta V_D \\ w_D(t) \end{bmatrix}$$

$$x(t) = \begin{bmatrix} i_Q \\ V_{Q_{Inverter}} \end{bmatrix}, A = \begin{bmatrix} -\frac{R}{L_Q} & \frac{1}{L_Q}\sqrt{\frac{2}{3}} \\ 0 & 0 \end{bmatrix},$$

$$B = \begin{bmatrix} \frac{1}{L_Q} \\ 0 \end{bmatrix}, M = \begin{bmatrix} \frac{1}{L_Q}\sqrt{\frac{2}{3}} & 0 \\ 0 & 1 \end{bmatrix}, w(t) = \begin{bmatrix} \Delta V_Q \\ w_Q(t) \end{bmatrix}$$

and for the output matrices:

$$C = [R\ 0], D = [0].$$

The method thus makes it possible to establish two Kalman models for the electromechanical actuator system 1 along the axis d and alone the axis q, that it is appropriate to process independently.

For these two Kalman models, the constants R, $L_Q$ and $L_D$, and Ke are theoretical values. The uncertainties concerning these values are considered to be an external disturbance, which disturbance is already taken into account in the two Kalman models. By way of example, it is possible to rely on manufacturer data for imposing these values. Likewise, p is known from manufacturer data, for example.

Once the two Kalman models have been established, the method thus includes a second step 200 of determining the states x(t) of these two models by Kalman filters.

For this purpose, the above specified models are used in this example in discrete form.

Putting the Kalman model into the discrete form and applying the Kalman algorithm to the resulting discrete model are well known to the person skilled in the art and are therefore not described in detail herein. For further details on putting two Kalman models into discrete form and on the recurrence equations of the Kalman algorithm, reference may be made by way of example to the book "Stochastic Models, Estimation and Control", Volume 141-1, Mathematics in Science and Engineering by P. S. Maybeck.

The known Kalman algorithm applied to the two discrete Kalman models thus makes it possible to obtain estimates for x(t) and thereby to obtain estimates for the voltage drops $V_{D_{Inverter}}$ and $V_{Q_{Inverter}}$ of the inverter 11 on the two axes d and q, and thus from the operational data $i_D$, $i_Q$, VD, VQ, and $\omega$. Once the voltage drops of the inverter 11 have been estimated, the method has a third step 300 of estimating various electrical parameters associated with the electromechanical actuator system 1, including at least the estimated motor torque constant $Ke_{est}$. Preferably, the method serves to estimate other electrical parameters, namely $R_{est}$ the resistance of the motor 12, and $L_{est}$ the inductance of the motor 12, it being understood that in the first step, the values R, $L_D$, and $L_Q$ were set at nominal theoretical values selected on the basis of manufacturer data.

To this end, it should be recalled that the electrical equations (3) set out above may be written with the real parameters in the following form:

$$\begin{cases} \sqrt{\frac{2}{3}}\,(V_D + V_{D_{Inverter}}) = R_{real}\, i_D + L_{D_{real}} \frac{di_I}{dt} - L_{Q_{real}} p\omega i_Q \\ \sqrt{\frac{2}{3}}\,(V_Q + V_{Q_{Inverter}}) = R_{real}\, i_Q + L_{Q_{real}} \frac{di_Q}{dt} + L_{D_{real}} p\omega i_D + \omega Ke_{real} \end{cases} \quad (4)$$

It is assumed that $L_{Q_{real}} = L_{D_{real}} = L_{real}$.

On the basis of this assumption and from the system of equations (4), the following system of linear equations (5) is obtained corresponding to the $n^{th}$ measurements taken and used in the method (current delivered by the inverter 11 to the motor 12, control voltage, and speed of rotation of the outlet shaft of the motor 12):

$$\begin{cases} \sqrt{\frac{2}{3}}(V_D(t_n)+V_{D_{Inverter}}(t_n)) = R_{real}(t_n)i_D(t_n)+L_{real}(t_n)\frac{di_D(t_n)}{dt_n}L_{real}(t_n)p\omega(t_n)i_Q(t_n) \\ \sqrt{\frac{2}{3}}(V_Q(t_n)+V_{Q_{Inverter}}(t_n)) = R_{real}(t_n)i_Q(t_n)+L_{real}(t_n)\frac{di_Q(t_n)}{dt_n}+L_{real}(t_n)p\omega(t_n)i_I(t_n)+\omega(t_n)Ke_{real}(t_n) \end{cases} \quad (5)$$

that can also be written in the form $X_n = h_n \theta_{n_{real}}$ with:

$$X_n = \begin{bmatrix} \sqrt{\frac{2}{3}}(V_D(t_n)+V_{D_{Inverter}}(t_n)) \\ \sqrt{\frac{2}{3}}(V_Q(t_n)+V_{Q_{Inverter}}(t_n)) \end{bmatrix}$$

$$h_n = \begin{bmatrix} i_D(t_n) & \left(\frac{di_D(t_n)}{dt_n}-p\omega(t_n)i_Q(t_n)\right) & 0 \\ i_Q(t_n) & \left(\frac{di_Q(t_n)}{dt_n}+p\omega(t_n)i_D(t_n)\right) & \omega(t_n) \end{bmatrix}$$

$$\theta_{n_{real}} = \begin{bmatrix} R_{real}(t_n) \\ L_{real}(t_n) \\ Ke_{real}(t_n) \end{bmatrix}$$

Nevertheless, as already mentioned, the measurements taken and used by the electromechanical actuator system 1 are usually found to be noisy. To make the system of equations (5) more realistic by causing account to be taken of these uncertainties about the measurements, a vector $v_n$ corresponding to nonbiased white noise is introduced into the system of equations, thus giving:

$$Y_n = h_n \theta_{n_{est}} - v_n$$

where:

$$Y_n = \begin{bmatrix} \sqrt{\frac{2}{3}}(V_D(t_n)+V_{D_{Inverter}}(t_n)) \\ \sqrt{\frac{2}{3}}(V_Q(t_n)+V_{Q_{Inverter}}(t_n)) \end{bmatrix}$$

$$h_n = \begin{bmatrix} i_D(t_n) & \left(\frac{di_D(t_n)}{dt_n}-p\omega(t_n)i_Q(t_n)\right) & 0 \\ i_Q(t_n) & \left(\frac{di_Q(t_n)}{dt_n}+p\omega(t_n)i_D(t_n)\right) & \omega(t_n) \end{bmatrix}$$

$$\theta_{n_{est}} = \begin{bmatrix} R_{est}(t_n) \\ L_{est}(t_n) \\ Ke_{est}(t_n) \end{bmatrix}$$

Knowing that the data $V_{D_{Inverter}}$ and $V_{Q_{Inverter}}$ was estimated in preceding step 200, that the data p is known (from manufacturer data), and that the data in, $i_D$, $i_Q$, $V_D$, $V_Q$, and $\omega$ is measured data, it only remains to determine the parameter vector $\theta_{n_{est}}$.

In this example, this determination is performed by stochastic calculation. More precisely, this determination is performed by a recursive least-squares algorithm that makes it possible to search for $\theta_{n_{est}}$ while minimizing the criterion $\varepsilon_n = (Y_n - X_n)^T (Y_n - X_n)$.

Such an algorithm is well known to the person skilled in the art, and is therefore not described in detail herein. For more details, reference may be made by way of example to the book "Stochastic Models, Estimation and Control", Volume 141-1, Mathematics in Science and Engineering, by P. S. Maybeck.

This thus makes it possible to estimate the electromagnetic torque coefficient of the motor $Ke_{est}$, the resistance of the motor $R_{est}$, and the inductance of the motor $L_{est}$. This makes it possible to monitor the state of health of the electromechanical actuator system 1 on the basis of known ageing relationships of said system and on the basis of these estimated parameters, and/or to put into place optionally preventative maintenance operations next time the aircraft remains on the ground.

Once the electromagnetic torque coefficient of the motor $Ke_{est}$ has been estimated, the method includes a fourth step 400 of calculating the electromagnetic torque of the motor $C_{elec}$ from the following formula:

$$C_{elec} = \frac{3}{2}Ke_{phase}i_Q + \frac{3}{2}Ke_{phase}\Delta i_Q$$

where $\Delta i_Q$ is the error on electric current measurement, which is bounded.

Preferably, the method includes a fifth step 500 of estimating a plurality of mechanical parameters associated with the electromechanical actuator system 1, namely the viscous friction coefficient $Coef_{f\_visc}$ of the mechanical portion 20, the dynamic dry friction torque $C_{f\_dry}$ of the mechanical portion 20, and the direct efficiency $\rho_{direct}$ of mechanical portion 20 (i.e. the efficiency when the load connected to the motor opposes the movement of the outlet shaft of the motor, as contrasted to the indirect efficiency $\rho_{indirect}$, which corresponds to the efficiency when the load connected to the motor accompanies the movement of the outlet shaft of the motor, with the relationship between direct efficiency and indirect efficiency being given by:

$$\left(\frac{1}{\rho_{direct}}-1\right) = (1-\rho_{indirect}).$$

To this end, the fundamental principle of dynamics is applied to the outlet shaft of the motor 12 gives:

$$C_{elec} + C_{load} - Coef_{f\_visc}\omega - \\ \text{sign}(\omega)\left(C_{f\_dry}+|C_{load}|\left(\frac{1}{\rho_{direct}}-1\right)\right) = J_{mom}\frac{d\omega}{dt}$$

with $$C_{load} = F \frac{pitch_{screw}}{2\pi},$$

where F is the aerodynamic force to which the actuator 21 is subjected as measured using a sensor carried by the actuator 21, and $J_{mom}$ is the moment of inertia of the system as seen by the shaft of the motor 12.

$$K_{eff} = \frac{1}{\rho_{direct}} - 1$$

The following can be written:

$$J_{mom}\frac{d\omega}{dt} - C_{elec} - C_{load} = [-\omega \quad -\text{sign}(\omega) \quad -\text{sign}(\omega)|C_{load}|] \begin{bmatrix} Coef_{f\_visc} \\ C_{f\_dry} \\ K_{eff} \end{bmatrix}$$

This leaves the following linear equation corresponding to the $n^{th}$ measurements taken and used in the method:

$$J_{mom}\frac{d\omega(t_n)}{dt_n} - C_{elec}(t_n) - C_{load}(t_n) = [$$

$$-\omega(t_n) \quad -\text{sign}(\omega) \quad -\text{sign}(\omega)|C_{load}|] \begin{bmatrix} Coef_{f\_visc} \\ C_{f\_dry} \\ K_{eff} \end{bmatrix}$$

(6) that can also be written in the form $X_n = h_n \theta_n$, with:

$$X_n = \left[ J_{mom}\frac{d\omega(t_n)}{dt_n} - C_{elec}(t_n) - C_{load}(t_n) \right]$$

$$h_n = [-\omega(t_n) \quad -\text{sign}(\omega(t_n)) \quad -\text{sign}(\omega(t_n))|C_{load}(t_n)|]$$

$$\theta_n = \begin{bmatrix} Coef_{f\_visc} \\ C_{f\_dry} \\ K_{eff} \end{bmatrix}$$

Nevertheless, as already mentioned, the measurements taken and used by the electromechanical actuator system 1 are usually found to be noisy. Because of the electric current measurement error $\Delta i_Q$, there remains uncertainty concerning the electromagnetic torque of the motor $C_{elec}$. In order to make equation (6) more realistic, equation (6) is modified so as to make it take this uncertainty into account. In this example, the uncertainty concerning the electromagnetic torque of the motor $C_{elec}$ is expressed by centered white noise $v_n$ of known spectral power density:

$$\begin{cases} \Delta C_{elec}(t_n) = v_n = \frac{3}{2} Ke_{phase} \Delta i_Q(t_n) \\ C_{elec\_nom}(t_n) = \frac{3}{2} Ke_{phase} i_Q(t_n) \\ C_{elec}(t_n) = C_{elec\_nom}(t_n) + \Delta C_{elec}(t_n) \end{cases}$$

The following equation is thus obtained:

$$Y_n = h_n \theta_{n_{est}} + v_n \text{ where:}$$

$$Y_n = \left[ J_{mom}\frac{d\omega(t_n)}{dt_n} - C_{elec\_nom}(t_n) - C_{load}(t_n) \right]$$

$$h_n = [-\omega(t_n) \quad -\text{sign}(\omega(t_n)) \quad -\text{sign}(\omega(t_n))|C_{load}(t_n)|]$$

$$\theta_{n_{est}} = \begin{bmatrix} Coef_{f\_visc_{est}} \\ C_{f\_dry_{est}} \\ K_{eff_{est}} \end{bmatrix}$$

The angular acceleration $$\frac{d\omega}{dt}$$

in this example is calculated from the angular speed $\omega$, but in a variant it could be measured at the motor 12. Also, knowing that the data Ke was estimated in the first step 300, that the data $J_{mom}$ and $pitch_{screw}$ is known, and that the data $\omega$, $i_Q$, F is measured operational data, it only remains to determine the parameter vector $\theta_{n_{est}}$.

In this example, this determination is performed by stochastic calculation. More precisely, this determination is performed by a recursive least-squares algorithm that makes it possible to search for $\theta_n$ while minimizing the criterion $\varepsilon_n = (Y_n - X_n)^T(X_n - Y_n)$.

Furthermore, it should be recalled that the algorithm needs to take account of the fact that the preceding equation is applicable only if the speed of rotation of the motor 12 is not zero. Under such circumstances when the speed of rotation of the motor 12 in absolute value was above a certain threshold value that is defined as being arbitrarily close to zero, the parameters estimated in the algorithm are "frozen" on the most recent value. Preferably, the pressure is adjusted so as to be as close as possible to zero as the accuracy of the Kalman filter becomes greater.

Considering P to be the self correlation matrix of the estimation error $\varepsilon_n$, and $R_v$ to be the covariance matrix of the noise $v_n$, the algorithm is written as follows:

if $\omega(n)$<threshold or if −threshold<$\omega(n)$ then
$\quad K_n = K_{n-1}$ $\quad \tilde{\theta}_{n_{est}} = \tilde{\theta}_{n-1_{est}}$ $\quad P_n = P_{n-1}$ else
$\quad$ if $n=1$ (initial conditions), then $\quad\quad K_n = P_{00} h_n [R_v + h_n^T P_{00} h_n]^{-1}$ $\quad\quad \hat{\theta}_{n_{est}} = \hat{\theta}_{00_{est}} + K_n(Y_n - h_n^T \hat{\theta}_{00\_est})$ $\quad\quad P_n = (I - K_n h_n^T) P_{00}$ $\quad$ else $\quad\quad K_n = P_{n-1} h_n [R_v + h_n^T P_{n-1} h_n]^{-1}$ $\quad\quad \hat{\theta}_{n_{est}} = \hat{\theta}_{n-1_{est}} + K_n(Y_n - h_n^T \hat{\theta}_{n-1_{est}})$ $\quad\quad P_n = (I - K_n h_n^T) P_{n-1}$ This thus enables the viscous friction coefficient $Coef_{f\_visc}$, the dynamic dry friction torque $C_{f\_dry}$, and the direct efficiency $\rho_{direct}$ to be estimated. This makes it possible to monitor the state of health of the electromechanical actuator system 1 from known ageing relationships for said system and for the estimated parameters. By way of example, it is thus possible to estimate the ageing of the electromechanical actuator system 1 and/or to undertake optionally preventative maintenance operations next time the aircraft remains on the ground.

The above-described method thus makes it possible to estimate various electrical and mechanical parameters suitable for monitoring the state of health of the electromechanical actuator system 1. As mentioned above, the method is implemented during a real flight of the aircraft and not during a maneuver dedicated to estimating these parameters or while the aircraft is out of service.

The method can thus be performed directly during a maneuver of the aircraft that requires the electromechanical actuator system 1 to be operated, or indeed after the maneuver has been undertaken, with the various measurements needed for performing the method previously being recorded during the maneuver so that they can be used retrospectively by the method.

The data obtained by the method of the invention thus makes it possible to implement various strategies for monitoring and taking action on the electromechanical actuator system 1. For example, the method may include an additional step of forming a database made up of the various values for the electrical and mechanical parameters as estimated over time and on different flights of the aircraft. This database thus makes it possible to determine how the various electrical or mechanical parameters of the system vary over time. The database may also serve to facilitate monitoring other electromechanical actuator systems.

Naturally, the invention is not limited to the implementation described, and variant implementations may be provided without going beyond the ambit of the invention as defined by the claims.

The invention claimed is:

1. A method of monitoring an electromechanical actuator system including at least one inverter, a motor powered by the inverter, and an actuator driven by the motor, the method comprising the steps of:
    estimating the drop of voltage in the power supply to the motor associated with defects of the inverter by means of a Kalman filter taking account of operational data including at least one electric current delivered by the inverter to the motor, at least one control voltage of the inverter, and at least one speed of rotation of the outlet shaft of the motor;
    estimating at least the electromagnetic torque coefficient of the motor by taking account of the estimated voltage drop and the operational data including the current delivered by the inverter to the motor, the control voltage of the inverter, the derivative of the current delivered by the inverter to the motor, and the speed of rotation of the outlet shaft of the motor; and
    calculating the electromagnetic torque of the motor from the electromagnetic torque coefficient of the motor and the operational data constituted by the electric current delivered by the inverter to the motor.

2. The method according to claim 1, wherein at the same time as estimating the electromagnetic torque coefficient of the motor, other electrical parameters of the electromechanical actuator system are also estimated.

3. The method according to claim 2, wherein the other electrical parameters that are estimated are the resistance of the motor and the inductance of the motor.

4. The method according to claim 1, including an additional step of estimating at least one mechanical parameter of the electromechanical actuator system from the electromagnetic torque, from operational data including at least the speed of rotation of the outlet shaft of the motor, and from the aerodynamic force to which the actuator is subjected.

5. The method according to claim 4, wherein the mechanical parameter is the viscous friction coefficient and/or the dynamic drive friction torque and/or the efficiency of the assembly comprising the motor and the actuator.

* * * * *